(12) United States Patent
Kim

(10) Patent No.: US 11,822,819 B2
(45) Date of Patent: Nov. 21, 2023

(54) MEMORY SYSTEM AND OPERATING METHOD THEREOF

(71) Applicant: SK hynix Inc., Gyeonggi-do (KR)

(72) Inventor: Jung Woo Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 59 days.

(21) Appl. No.: 17/499,263

(22) Filed: Oct. 12, 2021

(65) Prior Publication Data

US 2022/0391139 A1 Dec. 8, 2022

(30) Foreign Application Priority Data

Jun. 3, 2021 (KR) ........................ 10-2021-0072086

(51) Int. Cl.
*G06F 3/06* (2006.01)
*G11C 11/408* (2006.01)

(52) U.S. Cl.
CPC ............ *G06F 3/0659* (2013.01); *G06F 3/064* (2013.01); *G06F 3/0619* (2013.01); *G06F 3/0679* (2013.01); *G11C 11/4085* (2013.01)

(58) Field of Classification Search
CPC ...... G06F 3/0659; G06F 3/0619; G06F 3/064; G06F 3/0679; G11C 11/4085
See application file for complete search history.

(56) References Cited

U.S. PATENT DOCUMENTS

2018/0315487 A1* 11/2018 Avraham ............. G11C 29/765
2019/0198514 A1* 6/2019 Kim ....................... H10B 43/35
2022/0066894 A1* 3/2022 Namala .................. G11C 16/08

FOREIGN PATENT DOCUMENTS

KR 1020200079852 A 7/2020
KR 1020210013445 A 2/2021

* cited by examiner

*Primary Examiner* — Francisco A Grullon
(74) *Attorney, Agent, or Firm* — IP & T GROUP LLP

(57) ABSTRACT

Embodiments of the present disclosure relate to a memory system and a method for operating the memory system. According to embodiments of the present disclosure, a memory system may determine a target write data which is to be written to one of a plurality of super memory blocks, and may write the target write data based on a size of the target write data, to a first super memory block which includes at least one bad word line or a second super memory block which includes no bad word line.

14 Claims, 13 Drawing Sheets

MEMORY SYSTEM AND OPERATING METHOD THEREOF

CROSS-REFERENCES TO RELATED APPLICATION

The present application claims priority under 35 U.S.C. 119(a) to Korean patent application number 10-2021-0072086 filed on Jun. 3, 2021, which is incorporated herein by reference in its entirety.

BACKGROUND

1. Technical Field

The embodiments of the present disclosure relate to a memory system and an operating method thereof.

2. Related Art

A memory system includes a data storage device that stores data on the basis of a request from a host, such as a computer, servers, a smartphone, a tablet PC, or other electronic devices. Examples of the memory system span from a traditional magnetic-disk-based hard disk drive (HDD) to a semiconductor-based data storage device such as a solid state drive (SSD), a universal flash storage device (UFS), or an embedded MMC (eMMC) device.

The memory system may further include a memory controller for controlling a memory device. The memory controller may receive a command from the host and, on the basis of the received command, may execute the command or control read/write/erase operations on the memory devices in the memory system. The memory controller may be used to execute firmware operations for performing a logical operation for controlling such operations.

The memory device included in the memory system may include a plurality of memory blocks. In this case, as the storage capacity of a memory block increases, the number of word lines included in the memory block increases.

SUMMARY

Embodiments of the present disclosure are directed to a memory system and an operating method that are capable of using super memory block containing a bad word line more efficiently.

Embodiments of the present disclosure are directed to a memory system and an operating method that are capable of minimizing write performance degradation by a bad word line.

In one aspect, embodiments of the present disclosure may provide a memory system including a memory device including a plurality of memory blocks and a memory controller for communicating with the memory device and controlling the memory device.

The memory controller may determine a target write data which is to be written to one of a plurality of super memory blocks, wherein each super memory block includes one or more of the plurality of memory blocks.

The memory controller may write the target data, based on a size of the target write data, to a first super memory block which includes at least one bad word line or a second super memory block which includes no bad word line.

The memory controller may write the target write data to the first super memory block when a size of the target write data is equal to or less than a set threshold size, and write the target data to the second super memory block when the size of the target write data is greater than the set threshold size.

In another aspect, embodiments of the present disclosure may provide a method for operating a memory system including a memory device including a plurality of memory blocks.

The method for operating a memory system may include setting a plurality of super memory blocks each including one or more of the plurality of memory blocks.

The method for operating a memory system may include determining a target write data which is to be written to one of the plurality of super memory blocks.

The method for operating a memory system may include writing the target write data based on a size of the target write data, to a first super memory block which includes at least one bad word line or a second super memory block which includes no bad word line.

Writing the target write data based on size of the target write data, to the first super memory block or the second super memory block may include writing the target write data to the first super memory block when a size of the target write data is equal to or less than a set threshold size and writing the target data to the second super memory block when the size of the target write data is greater than the set threshold size.

Embodiments of the present disclosure may provide an advantage of using super memory blocks containing a bad word line more efficiently and minimizing write performance degradation by the bad word line.

DETAIL DESCRIPTION

Figure 1:
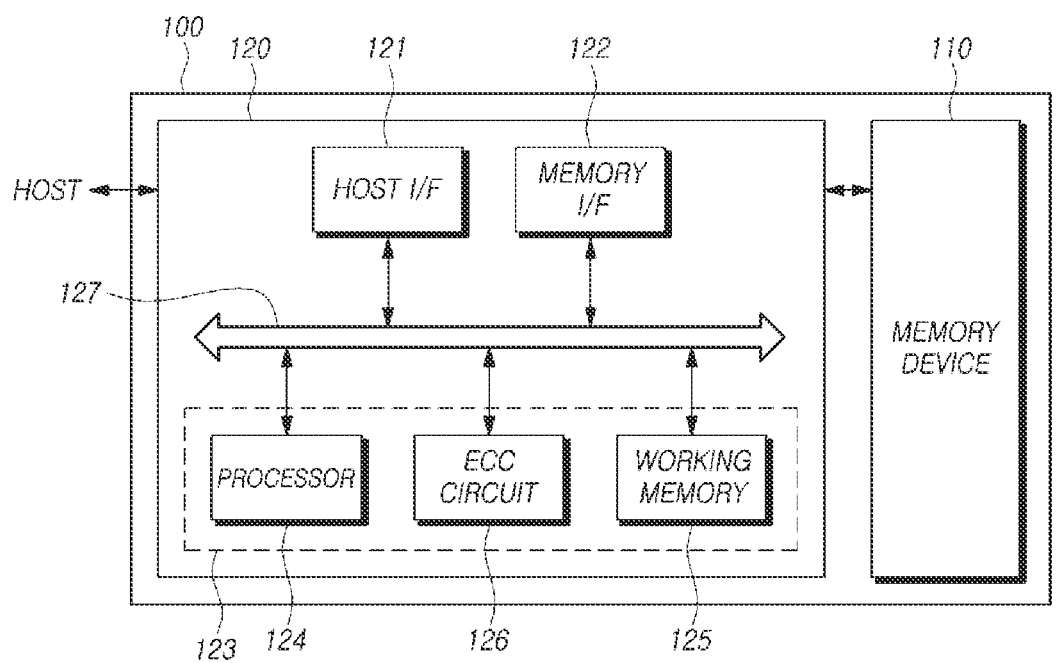
FIG. 1 is a schematic diagram illustrating a configuration of a memory system based on an embodiment of the disclosed technology.

Hereinafter, embodiments of the present disclosure are described in detail with reference to the accompanying drawings. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Various embodiments of the present invention are described below in more detail with reference to the accompanying drawings. However, the present invention may be embodied in different forms and variations, and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

When implemented at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

FIG. 1 is a diagram illustrating the schematic configuration of a memory system 100 based on an embodiment of the disclosed technology.

In some implementations, the memory system 100 may include a memory device 110 configured to store data, and a memory controller 120 configured to control the memory device 110.

The memory device 110 may include multiple memory blocks each including a plurality of memory cells for storing data. The memory device 110 may be configured to operate in response to control signals received from the memory controller 120. Operations of the memory device 110 may include, for example, a read operation, a program operation (also referred to as a "write operation"), an erasure operation, and the like.

The memory cells in the memory device 110 are used to store data and may be arranged in a memory cell array. The memory cell array may be divided into memory blocks of memory cells and each block includes different pages of memory cells. In typical implementations of NAND flash memory devices, a page of memory cells is the smallest memory unit that can be programmed or written, and the data stored in memory cells can be erased at the block level.

In some implementations, the memory device 110 may be implemented as various types, such as a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), or a spin transfer torque random access memory (STT-RAM).

The memory device 110 may be implemented in a three-dimensional array structure. Some embodiments of the disclosed technology are applicable to any type of flash memory devices having an electric charge storage layer. In an implementation, the electric charge storage layer may be formed of a conductive material, and such an electric charge storage layer can be called a floating gate. In another implementation, the electric charge storage layer may be formed of an insulating material, and such a flash memory device can be called a charge trap flash (CTF).

The memory device 110 may be configured to receive a command and an address from the memory controller 120 to access an area of the memory cell array selected using the address. That is, the memory device 110 may perform an operation corresponding to the received command on a memory area of the memory device having a physical address corresponding to the received address from the memory controller 120.

In some implementations, the memory device 110 may perform a program operation, a read operation, an erasure operation, and the like. During the program operation, the memory device 110 may write data in the area selected by the address. During the read operation, the memory device 110 may read data from a memory area selected by the address. During the erasure operation, the memory device 110 may erase data stored in a memory area selected by the address.

The memory controller 120 may control write (program), read, erasure, and background operations that are performed on the memory device 110. The background operation may include, for example, operations that are implemented to optimize the overall performance of the memory device 110, such as a garbage collection (GC) operation, a wear leveling (WL) operation, and a bad block management (BBM) operation.

The memory controller 120 may control the operation of the memory device 110 at the request of a host. Alternatively, the memory controller 120 may control the operation of the memory device 110 even in absence of request from the host when it performs such background operations of the memory device.

The memory controller 120 and the host may be separate devices. In some implementations, the memory controller 120 and the host may be integrated and implemented as a single device. In the following description, the memory controller 120 and the host will be discussed as separate devices as an example.

Referring to FIG. 1, the memory controller 120 may include a memory interface 122, a control circuit 123, and a host interface 121.

The host interface 121 may be configured to provide an interface for communication with the host.

When receiving a command from the host HOST, the control circuit 123 may receive the command through the host interface 121 and may perform an operation of processing the received command.

The memory interface 122 may be directly or indirectly connected to the memory device 110 to provide an interface for communication with the memory device 110. That is, the memory interface 122 may be configured to provide the memory device 110 and the memory controller 120 with an interface for the memory controller 120 to perform memory operations on the memory device 110 based on control signals and instructions from the control circuit 123.

The control circuit 123 may be configured to control the operation of the memory device 110 through the memory controller 120. For example, the control circuit 123 may include a processor 124 and a working memory 125. The control circuit 123 may further include an error detection/correction circuit (ECC circuit) 126 and the like.

The processor 124 may control the overall operation of the memory controller 120. The processor 124 may perform a logical operation. The processor 124 may communicate with the host HOST through the host interface 121. The processor 124 may communicate with the memory device 110 through the memory interface 122.

The processor 124 may be used to perform operations associated with a flash translation layer (FTL) to effectively manage the memory operations on the memory system 100. The processor 124 may translate a logical block address (LBA) provided by the host into a physical block address (PBA) through the FTL. The FTL may receive the LBA and translate the LBA into the PBA by using a mapping table.

There are various address mapping methods which may be employed by the FTL, based on the mapping unit. Typical address mapping methods may include a page mapping method, a block mapping method, and a hybrid mapping method.

The processor 124 may be configured to randomize data received from the host to write the randomized data to the memory cell array. For example, the processor 124 may randomize data received from the host by using a randomizing seed. The randomized data is provided to the memory device 110 and written to the memory cell array.

The processor 124 may be configured to derandomize data received from the memory device 110 during a read operation. For example, the processor 124 may derandomize data received from the memory device 110 by using a derandomizing seed. The derandomized data may be output to the host HOST.

The processor 124 may execute firmware (FW) to control the operation of the memory controller 120. The processor 124 may control the overall operation of the memory controller 120 and, in order to perform a logical operation, may execute (drive) firmware loaded into the working memory 125 during booting.

The firmware refers to a program or software stored on a certain nonvolatile memory and is executed inside the memory system 100.

In some implementations, the firmware may include various functional layers. For example, the firmware may include at least one of a flash translation layer (FTL) configured to translate a logical address in the host HOST requests to a physical address of the memory device 110, a host interface layer (HIL) configured to interpret a command that the host HOST issues to a data storage device such as the memory system 100 and to deliver the command to the FTL, and a flash interface layer (FIL) configured to deliver a command issued by the FTL to the memory device 110.

For example, the firmware may be stored in the memory device 110, and then loaded into the working memory 125.

The working memory 125 may store firmware, program codes, commands, or pieces of data necessary to operate the memory controller 120. The working memory 125 may include, for example, at least one among a static RAM (SRAM), a dynamic RAM (DRAM), and a synchronous RAM (SDRAM) as a volatile memory.

The error detection/correction circuit 126 may be configured to detect and correct one or more erroneous bits in the data by using an error detection and correction code. In some implementations, the data that is subject to the error detection and correction may include data stored in the working memory 125, and data retrieved from the memory device 110.

The error detection/correction circuit 126 may be implemented to decode data by using the error correction code. The error detection/correction circuit 126 may be implemented by using various decoding schemes. For example, a decoder that performs nonsystematic code decoding or a decoder that performs systematic code decoding may be used.

In some implementations, the error detection/correction circuit 126 may detect one or more erroneous bits on a sector basis. That is, each piece of read data may include multiple sectors. In the present disclosure, a sector may refer to a data unit that is smaller than the read unit (e.g., page) of a flash memory. Sectors constituting each piece of read data may be mapped based on addresses.

In some implementations, the error detection/correction circuit 126 may calculate a bit error rate (BER) and determine whether the number of erroneous bits in the data is within the error correction capability sector by sector. For example, if the BER is higher than a reference value, the error detection/correction circuit 126 may determine that the erroneous bits in the corresponding sector are uncorrectable and the corresponding sector is marked "fail." If the BER is lower than or equals to the reference value, the error detection/correction circuit 126 may determine that the corresponding sector is correctable or the corresponding sector can be marked "pass."

The error detection/correction circuit 126 may perform error detection and correction operations successively on all read data. When a sector included in the read data is correctable, the error detection/correction circuit 126 may move on to the next sector to check whether an error correction operation is needed on the next sector. Upon completion of the error detection and correction operations on all the read data in this manner, the error detection/correction circuit 126 may acquire information as to which sector is deemed uncorrectable in the read data. The error detection/correction circuit 126 may provide such information (e.g., address of uncorrectable bits) to the processor 124.

The memory system 100 may also include a bus 127 to provide a channel between the constituent elements 121, 122, 124, 125, and 126 of the memory controller 120. The bus 127 may include, for example, a control bus for delivering various types of control signals and commands, and a data bus for delivering various types of data.

By way of example, FIG. 1 illustrates the above-mentioned constituent elements 121, 122, 124, 125, and 126 of the memory controller 120. It is noted that some of the elements illustrated in the drawings may be omitted, or some of the above-mentioned constituent elements 121, 122, 124, 125, and 126 of the memory controller 120 may be integrated into a single element. In addition, in some implementations, one or more other constituent elements may be added to the above-mentioned constituent elements of the memory controller 120.

Figure 2:
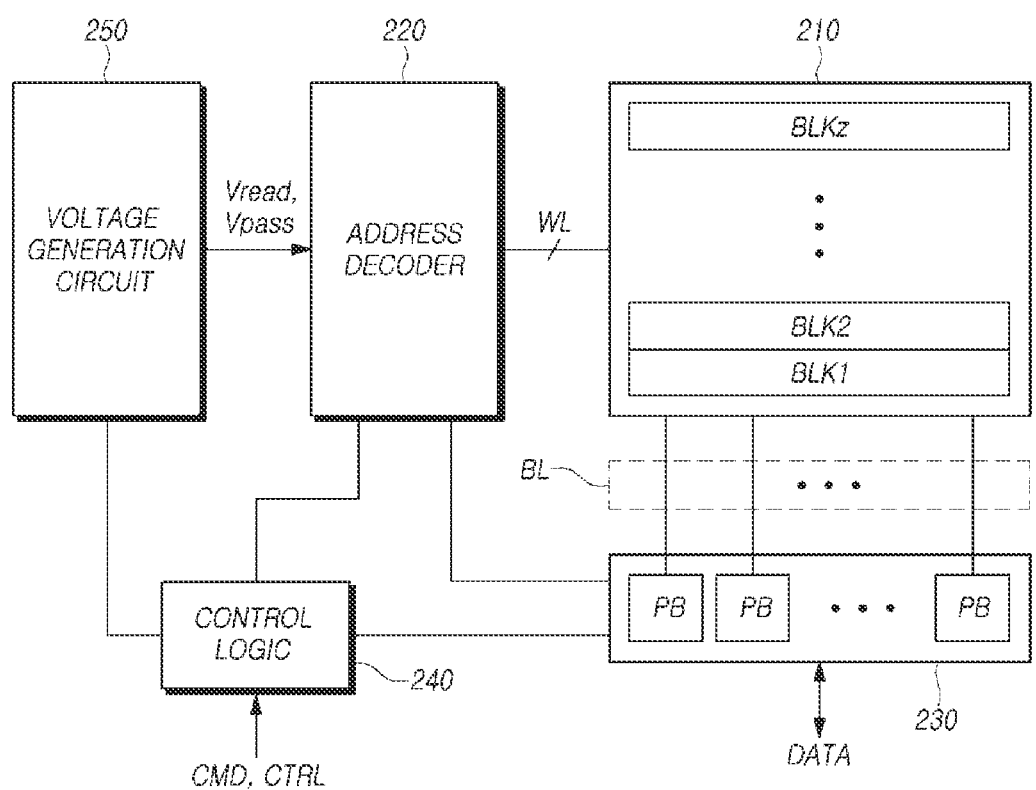
FIG. 2 is a block diagram schematically illustrating a memory device based on an embodiment of the disclosed technology.

FIG. 2 is a block diagram a schematically illustrating a memory device 110 based on an embodiment of the disclosed technology.

In some implementations, the memory device 110 based on an embodiment of the disclosed technology may include a memory cell array 210, an address decoder 220, a read/write circuit 230, a control logic 240, and a voltage generation circuit 250.

The memory cell array 210 may include multiple memory blocks BLK1-BLKz, where z is a natural number equal to or larger than 2.

In the multiple memory blocks BLK1-BLKz, multiple word lines WL and multiple bit lines BL may be disposed in rows and columns, and multiple memory cells MC may be arranged.

The multiple memory blocks BLK1-BLKz may be connected to the address decoder 220 through the multiple word lines WL. The multiple memory blocks BLK1-BLKz may be connected to the read/write circuit 230 through the multiple bit lines BL.

Each of the multiple memory blocks BLK1-BLKz may include multiple memory cells. For example, the multiple memory cells are nonvolatile memory cells. In some implementations, such nonvolatile memory cells may be arranged in a vertical channel structure.

The memory cell array 210 may be configured as a memory cell array having a two-dimensional structure. In some implementations, the memory cell array 210 may be arranged in a three-dimensional structure.

Each of the multiple memory cells included in the memory cell array 210 may store at least one bit of data. For example, each of the multiple memory cells included in the memory cell array 210 may be a single-level cell (SLC) configured to store one bit of data. As another example, each of the multiple memory cells included in the memory cell array 210 may be a multi-level cell (MLC) configured to store two bits of data per memory cell. As another example, each of the multiple memory cells included in the memory cell array 210 may be a triple-level cell (TLC) configured to store three bits of data per memory cell. As another example, each of the multiple memory cells included in the memory cell array 210 may be a quad-level cell (QLC) configured to store four bits of data per memory cell. As another example, the memory cell array 210 may include multiple memory cells, each of which may be configured to store at least five bits of data per memory cell.

Referring to FIG. 2, the address decoder 220, the read/write circuit 230, the control logic 240, and the voltage generation circuit 250 may operate as peripheral circuits configured to drive the memory cell array 210.

The address decoder 220 may be connected to the memory cell array 210 through the multiple word lines WL.

The address decoder 220 may be configured to operate in response to command and control signals of the control logic 240.

The address decoder 220 may receive addresses through an input/output buffer inside the memory device 110. The address decoder 220 may be configured to decode a block address among the received addresses. The address decoder 220 may select at least one memory block based on the decoded block address.

The address decoder 220 may receive a read voltage Vread and a pass voltage Vpass from the voltage generation circuit 250.

The address decoder 220 may, during a read operation, apply the read voltage Vread to a selected word line WL inside a selected memory block and apply the pass voltage Vpass to the remaining non-selected word lines WL.

The address decoder 220 may apply a verification voltage generated by the voltage generation circuit 250 to a selected word line WL inside a selected memory block, during a program verification operation, and may apply the pass voltage Vpass to the remaining non-selected word lines WL.

The address decoder 220 may be configured to decode a column address among the received addresses. The address decoder 220 may transmit the decoded column address to the read/write circuit 230.

The memory device 110 may perform the read operation and the program operation page by page. Addresses received when the read operation and the program operation are requested may include at least one of a block address, a row address, and a column address.

The address decoder 220 may select one memory block and one word line based on the block address and the row address. The column address may be decoded by the address decoder 220 and provided to the read/write circuit 230.

The address decoder 220 may include at least one of a block decoder, a row decoder, a column decoder, and an address buffer.

The read/write circuit 230 may include multiple page buffers PB. The read/write circuit 230 may operate as a "read circuit" when the memory cell array 210 performs a read operation, and may operate as a "write circuit" when the memory cell array 210 performs a write operation.

The above-mentioned read/write circuit 230 is also referred to as a page buffer circuit including multiple page buffers PB, or a data register circuit. The read/write circuit 230 may include a data buffer that participates in a data processing function and, in some implementations, may further include a cache buffer for data caching.

The multiple page buffers PB may be connected to the memory cell array 210 through the multiple bit lines BL. In order to detect or sense the threshold voltage Vth of the memory cells during a read operation and a program verification operation, the multiple page buffers PB may continuously supply a sensing current to the bit lines BL connected to the memory cells to detect, at a sensing node, a change proportional to the amount of current that varies depending on the program state of a corresponding memory cell, and may hold or latch the corresponding voltage as sensing data.

The read/write circuit 230 may operate in response to page buffer control signals output from the control logic 240.

During a read operation, the read/write circuit 230 senses a voltage value of a memory cell and the voltage value is read out as data. The read/write circuit 230 temporarily stores the retrieved data, and outputs the data DATA to the input/output buffer of the memory device 110. In an embodiment, the read/write circuit 230 may include a column selection circuit, in addition to the page buffers PB or page registers.

The control logic 240 may be connected to the address decoder 220, the read/write circuit 230, and the voltage generation circuit 250. The control logic 240 may receive a command CMD and a control signal CTRL through the input/output buffer of the memory device 110.

The control logic 240 may be configured to control the overall operation of the memory device 110 in response to the control signal CTRL. The control logic 240 may output a control signal for adjusting the voltage level of sensing nodes of multiple page buffers PB to a pre-charge voltage level.

The control logic 240 may control the read/write circuit 230 to perform a read operation in the memory cell array 210. The voltage generation circuit 250 may generate a read voltage tread and a pass voltage Vpass, which are used during the read operation, in response to a voltage generation circuit control signal output from the control logic 240.

A memory block BLK included in the memory device 110 may include multiple pages PG. In some implementations, a plurality of memory cells arranged in columns form memory cell strings, and a plurality of memory cells arranged in rows form memory blocks. Each of the multiple pages PG is coupled to one of word lanes WL, and each of the memory cell strings STR is coupled to one of bit lines BL.

In the memory block BLK, multiple word lines WL and multiple bit lines BL may be arranged in rows and columns. For example, each of the multiple word lines WL may be arranged in the row direction, and each of the multiple bit lines BL may be arranged in the column direction. As another example, each of the multiple word lines WL may be arranged in the column direction, and each of the multiple bit lines BL may be arranged in the row direction.

In some implementations, the multiple word lines WL and the multiple bit lines BL may intersect with each other, thereby addressing a single memory cell in the array of multiple memory cells MC. In some implementations, each memory cell MC may include a transistor TR that includes a material layer that can hold an electrical charge.

For example, the transistor TR arranged in each memory cell MC may include a drain, a source, and a gate. The drain (or source) of the transistor TR may be connected to the corresponding bit line BL directly or via another transistor TR. The source (or drain) of the transistor TR may be connected to the source line (which may be the ground) directly or via another transistor TR. The gate of the transistor TR may include a floating gate (FG) surrounded by an insulator, and a control gate (CG) to which a gate voltage is applied from a word line WL.

In each of the multiple memory blocks BLK1-BLKz, a first selection line (also referred to as a source selection line or a drain selection line) may be additionally arranged outside the first outermost word line, which is closer to the read/write circuit 230 among two outermost word lines, and a second selection line (also referred to as a drain selection line or a source selection line) may be additionally arranged outside the other second outermost word line.

In some implementations, at least one dummy word line may be additionally arranged between the first outermost word line and the first selection line. In addition, at least one dummy word line may be additionally arranged between the second outermost word line and the second selection line.

A read operation and a program operation (write operation) of the memory block may be performed page by page, and an erasure operation may be performed memory block by memory block.

Figure 3:
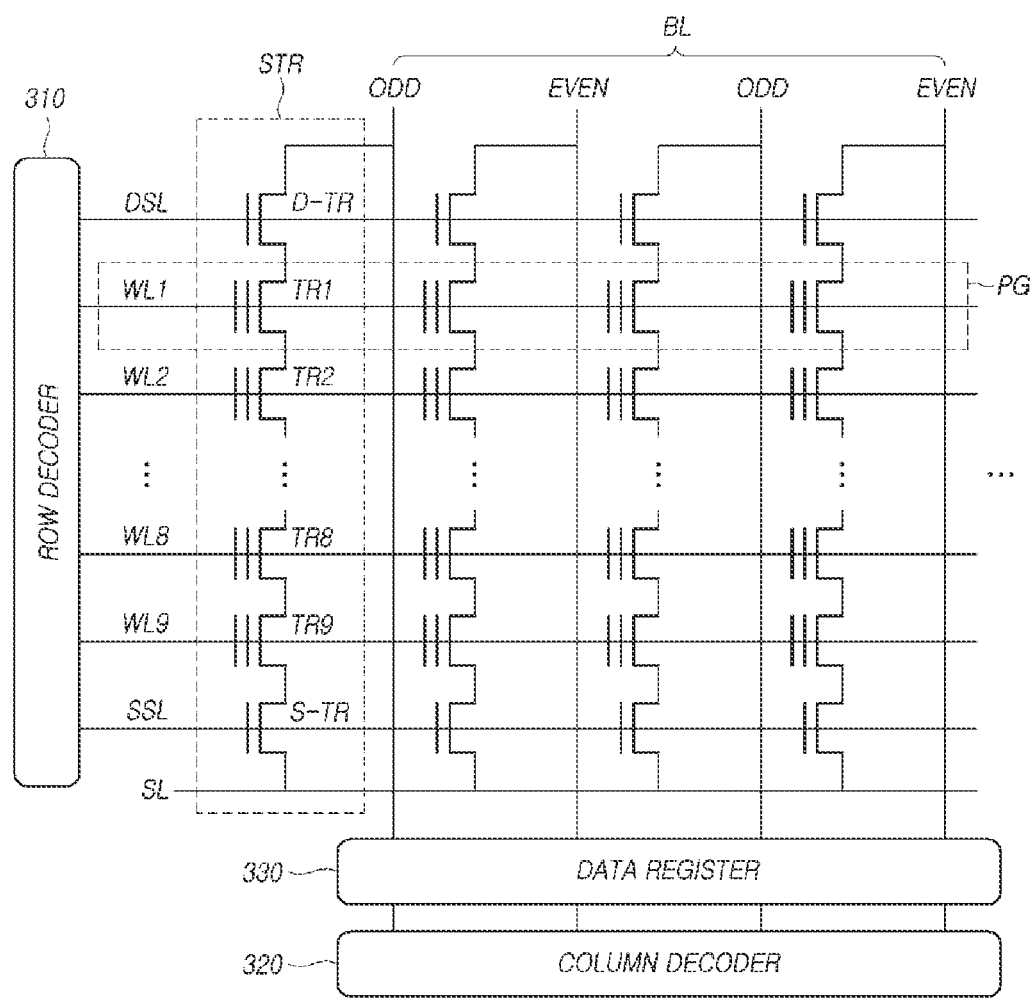
FIG. 3 is a diagram illustrating a structure of word lines and bit lines of a memory device based on an embodiment of the disclosed technology.

FIG. 3 is a diagram illustrating a structure of word lines WL and bit lines BL of a memory device 110 based on an embodiment of the disclosed technology.

Referring to FIG. 3, the memory device 110 has a core area in which memory cells MC are arranged, and an auxiliary area (the remaining area other than the core area) to include circuitry that is used to perform the operations of the memory cell array 210.

In the core area, a certain number of memory cells arranged in one direction can be called "page" PG, and a certain number of memory cells that are coupled in series can be called "memory cell string" STR.

The word lines WL1-WL9 may be connected to a row decoder 310. The bit lines BL may be connected to a column decoder 320. A data register 330, which corresponds to the read/write circuit 230 of FIG. 2, may exist between the multiple bit lines BL and the column decoder 320.

The multiple word lines WL1-WL9 may correspond to multiple pages PG.

For example, each of the multiple word lines WL1-WL9 may correspond to one page PG as illustrated in FIG. 3. When each of the multiple word lines WL1-WL9 has a large size, each of the multiple word lines WL1-WL9 may correspond to at least two (e.g., two or four) pages PG. Each page PG is the smallest unit in a program operation and a read operation, and all memory cells MC within the same page PG may perform simultaneous operations when conducting a program operation and a read operation.

The multiple bit lines BL may be connected to the column decoder 320. In some implementations, the multiple bit lines BL may be divided into odd-numbered bit lines BL and even-numbered bit lines BL such that a pair of odd-numbered bit line and even-numbered bit line is coupled in common to a column decoder 320.

In accessing a memory cell MC, the row decoder 310 and the column decoder 320 are used to locate a desired memory cell based on the address.

In some implementations, the data register 330 plays an important role because all data processing by the memory device 110, including program and read operations, occurs via the data register 330. If data processing by the data register 330 is delayed, all of the other areas need to wait until the data register 330 finishes the data processing, degrading the overall performance of the memory device 110.

Referring to the example illustrated in FIG. 3, in one memory cell string STR, multiple transistors TR1-TR9 may be connected to multiple word lines WL1-WL9, respectively. In some implementations, the multiple transistors TR1-TR9 correspond to memory cells MC. In this example, the multiple transistors TR1-TR9 include control gates CG and floating gates FG.

The multiple word lines WL1-WL9 include two outermost word lines WL1 and WL9. A first selection line DSL may be additionally arranged outside the first outermost word line WL1, which is closer to the data register 330 and has a shorter signal path compared to the other outermost word line WL9. A second selection line SSL may be additionally arranged outside the other second outermost word line WL9.

The first selection transistor D-TR, which is controlled to turn on/off by the first selection line DSL, has a gate electrode connected to the first selection line DSL, but includes no floating gate FG. The second selection transistor S-TR, which is controlled to turn on/off by the second selection line SSL, has a gate electrode connected to the second selection line SSL, but includes no floating gate FG.

The first selection transistor D-TR is used as a switch circuit that connects the corresponding memory cell string STR to the data register 330. The second selection transistor S-TR is used as a switch that connects the corresponding memory cell string STR to the source line SL. That is, the first selection transistor D-TR and the second selection transistor S-TR can be used to enable or disable the corresponding memory cell string STR.

In some implementations, the memory system 100 applies a predetermined turn-on voltage Vcc to the gate electrode of the first selection transistor D-TR, thereby turning on the first selection transistor D-TR, and applies a predetermined turn-off voltage (e.g., 0V) to the gate electrode of the second selection transistor S-TR, thereby turning off the second selection transistor S-TR.

The memory system 100 turns on both of the first and second selection transistors D-TR and S-TR during a read operation or a verification operation. Accordingly, during a read operation or a verification operation, an electric current may flow through the corresponding memory cell string STR and drain to the source line SL, which corresponds to the ground, such that the voltage level of the bit line BL can be measured. However, during a read operation, there may be a time difference in the on/off timing between the first selection transistor D-TR and the second selection transistor S-TR.

The memory system 100 may apply a predetermined voltage (e.g., +20V) to the substrate through a source line SL during an erasure operation. The memory system 100 applies a certain voltage to allow both the first selection transistor D-TR and the second selection transistor S-TR to float during an erasure operation. As a result, the applied erasure voltage can remove electrical charges from the floating gates FG of the selected memory cells.

Figure 4:
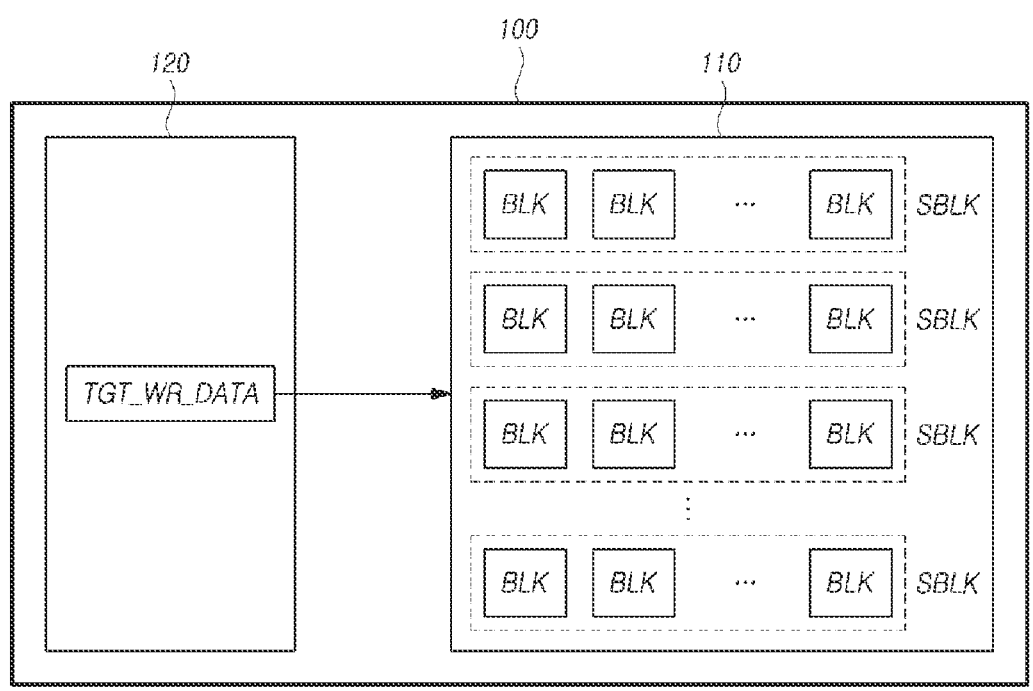
FIG. 4 is a schematic diagram illustrating an operation of a memory system according to embodiments of the present disclosure.

FIG. 4 is a schematic diagram illustrating an operation of a memory system according to embodiments of the present disclosure.

Referring to FIG. 4, a memory controller 120 in memory system 100 may determine a target write data TGT_WR_DATA, which is to be written to one of a plurality of super memory blocks SBLK included in a memory device 110.

The memory controller 120 may group a plurality of memory blocks BLK included in a memory device 110 into the plurality of super memory blocks SBLK.

Each of the super memory blocks SBLK may include one or more of the plurality of memory blocks BLK included in the memory device 110.

At this time, one or more of the plurality of memory blocks BLK included in a super memory block SBLK may be selected according to specific conditions.

In one embodiment, each of one or more of the plurality of memory blocks BLK included in a super memory block SBLK may be located on different memory die in the memory device 110 or located on different plane in the same memory die.

In another embodiment, each of one or more of the plurality of memory blocks BLK included in a super memory block SBLK may have same index value.

In still another embodiment, each of one or more of the plurality of memory blocks BLK included in a super memory block SBLK may be selected randomly from the plurality of memory blocks BLK included in the memory device 110.

An example of writing target write data TGT_WR_DATA to one of the super memory block SBLK included in memory device 110 will be described further hereinafter in FIG. 5.

Figure 5:
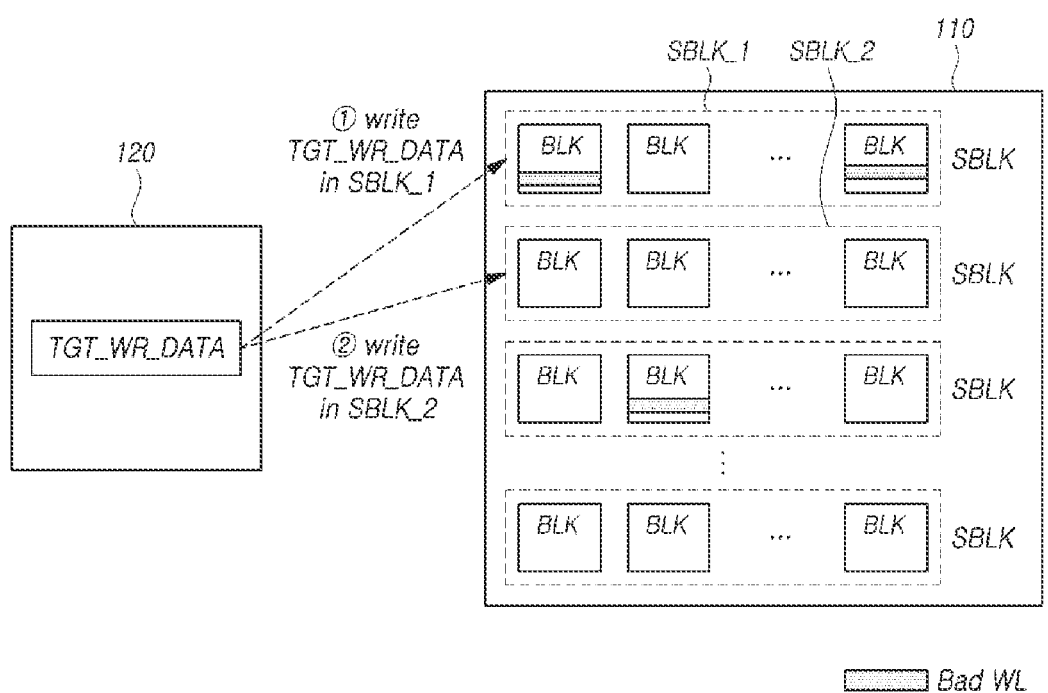
FIG. 5 is a diagram illustrating an operation in which the memory system writes the target write data to the memory device according to embodiments of the present disclosure.

FIG. 5 is a diagram illustrating an operation in which the memory system writes the target write data to the memory device according to embodiments of the present disclosure.

Referring to FIG. 5, the memory controller 120 in memory system 100 may write the target write data TGT_WR_DATA to a first super memory block SBLK_1 or a second super memory block SBLK_2.

The first super memory block SBLK_1 is a super memory block SBLK which includes at least one bad word line. A bad word line may be included in one of the plurality of memory blocks BLK included in the first super memory block SBLK_1.

The bad word line is a word line in which a failure may occur while programming data to a page corresponding to the word line or reading data from the page corresponding to the word line. The bad word line can be generated at the time of manufacturing the memory system 100 or while the memory controller 120 executes a read, write or erase operation for the memory device 110. The memory controller 120 may manage a had word line which exists in the memory device 110 by a specific data structure (e.g., a table, a list, an array) in which information about the bad word line which exists in the memory device is recorded.

A super memory block SBLK may include a plurality of pages. Each of the plurality of pages included in the super memory block SBLK is a page corresponding to a bad word line or a page corresponding to a normal word line which is not a bad word line. Hereinafter, a page corresponding to the bad word line may be referred to as a bad page and a page corresponding to the normal word line may be referred to as a normal page.

If data is written into the page corresponding to a bad word line, uncorrectable errors are more likely to occur while accessing data stored in the page corresponding to the bad word line.

Therefore, the memory controller 120 may control the memory device 100, when data is written to the first super memory block SBLK_1 in the memory device 110, not to write the data to a page corresponding to a bad word line.

On the other hand, the second super memory block SBLK_2 is a super memory block SBLK which includes no bad word line. All pages included in the second super memory block SBLK_2 may be normal pages. When data is written to the second super memory block, the data can be written to any page in the second super memory block SBLK_2.

In an embodiment of the present disclosure, the memory controller 120 may write the target write data TGT_WR_DATA ① to the first super memory block SBLK_1 or ② to the second super memory block SBLK_2 based on a size of the target write data TGT_WR_DATA.

The reason why the memory controller 120 determines a super memory block to which the target write data TGT_WR_DATA is written based on a size of the target write data TGT_WR_DATA is as follows.

When data is written to a super memory block SBLK, the memory device 110 may write the data by an interleaving method to maximize write performance.

Interleaving means that writing data to the plurality of memory blocks BLK included in a super memory block SBLK in parallel by distributing to a set size (e.g., a page size), When the memory device 110 writes the data to the super memory block SBLK by an interleaving method, the portion of the data may be written to the plurality of memory blocks BLK included in the super memory block SBLK simultaneously. So data write performance can be improved.

But, if the data is written to the page corresponding to a bad word line when the data is written to the super memory block SBLK by an interleaving method, failure can occur while accessing the data written in the super memory block SBLK. Therefore, the memory controller 120 may control the memory device 110 not to write data to the page corresponding to a bad word line while writing data to the super memory block SBLK.

For example, the memory controller 120 may set a memory block, among the plurality of memory blocks BLK included in the super memory block SBLK, containing a bad word line as a bad memory block and control the memory device 110 not to write data to the bad memory block.

In this case, a super memory block SBLK is used inefficiently because a normal page included in the bad memory block is not used. When the bad memory block is replaced by another memory block from an over-provisioning area, lifespan of the memory system 100 may be decreased.

Also, the number of memory blocks to which data is written simultaneously may be decreased when the data is written to the super memory block SBLK by an interleaving method. So the size of the data written to the plurality of memory blocks in a super memory block may be decreased and, as a result, data write performance may be degraded.

To solve the problem that occurs when target write data TGT_WR_DATA is written, by an interleaving method, to the super memory block SBLK including a bad word line, the memory block 120 may determine that it is okay to write the target write data TGT_WR_DATA to the super memory block SBLK including a bad word line by an interleaving method.

If it is determined to be okay to write the target write data TGT_WR_DATA to the super memory block SBLK including a bad word line by an interleaving method, the memory controller 120 may write the target data to the super memory block SBLK including a bad word line. The memory controller 120 may write a portion of the target data to a normal page and may not write a portion of the target data to a bad page.

But, if it is not okay to write the target write data TGT_WR_DATA to the super memory block SBLK including a bad word line by an interleaving method, the memory controller 120 may write the target data to the super memory block SBLK including no bad word line.

Specifically, when it is determined to be okay to write the target write data TGT_WR_DATA to the first super memory block SBLK_1 including a bad word line by an interleaving method, the memory controller 120 may write the target write data TGT_WR_DATA to the first super memory block SBLK_1. The memory controller 120 may use a super memory block SBLK more efficiently by only using a normal page in the super memory block SBLK including a bad word line. The memory controller 120 may use information indicating whether a page in the super memory block SBLK is a normal page or a bad page to use only a normal page in the super memory block SBLK. The memory controller 120 may increase data write performance by increasing the number of memory blocks to which data is written simultaneously while writing the target write data TGT_WR_DATA.

On the other hand, when it is determined not to be okay to write the target write data TGT_WR_DATA to the first super memory block SBLK_1 by an interleaving method because of a bad word line, the memory controller 120 may write the target write data TGT_WR_DATA to the second super memory block SBLK_2. By writing the target write data TGT_WR_DATA to the second super memory block, the memory controller 120 may avoid the risk of uncorrectable error caused by a bad word line, while writing the target write data by an interleaving method.

Whether it is okay to write the target write data TGT_WR_DATA to the first super memory block SBLK_1 including a bad word line by an interleaving method may be determined according to whether the size of target write data TGT_WR_DATA is less than or equal to the maximum value of the data size that can be written to the first super memory block SBLK_1 by an interleaving method. The memory controller 120 may determine the super memory block SBLK to which the target write data TGT_WR_DATA is written, based on the size of the target write data TGT_WR_DATA.

In the above, the operation in which the memory controller 120 of the memory system 100 determines the super memory block SBLK to which the target write data TGT_WR_DATA is to be written to when the memory controller 120 is to write the target write data TGT_WR_DATA to the super memory block SBLK in the memory device 110 is described.

Hereinafter, a detailed embodiment thereof will be described. First, a specific example of the target write data TGT_WR_DATA will be described.

In an embodiment of the present disclosure, the target write data TGT_WR_DATA may be meta-data. Meta-data is data storing meta information which is used to manage user data stored in the memory device 110. Meta-data may be stored in the spare area in the memory device 110.

In an embodiment, meta-data may include log data or history data corresponding to the data which is stored in the memory device 110, updated in the memory device 110 or deleted from the memory device.

In another embodiment, meta-data may be map data including mapping information between a logical address LA and a physical address PA.

Figure 6:
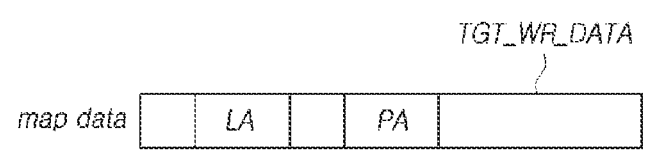
FIG. 6 is a diagram illustrating a target write data according to embodiments of the present disclosure.

FIG. 6 is a diagram illustrating a target write data according to embodiments of the present disclosure.

Referring to FIG. 6, the target write data TGT_WR_DATA may be map data including mapping information between a logical address LA and a physical address PA. Map data is used by the memory controller 120 to convert the logical address LA provided by host to the physical address PA for accessing the memory device 110 through flash translation layer FTL. When the mapping information between a specific logical address LA and a specific physical address PA is updated by executing a data write operation or background operation (e.g. garbage collection, wear leveling, read reclaim), the memory controller 120 may write the map data including updated map information to the memory device 110.

The memory controller 120 may determine the size of the map data to be written to the memory device 110 in advance, because the format of the map data is predetermined. The memory controller 120 may determine a super memory block to which the map data is written based on the size of the map data.

Figure 7:
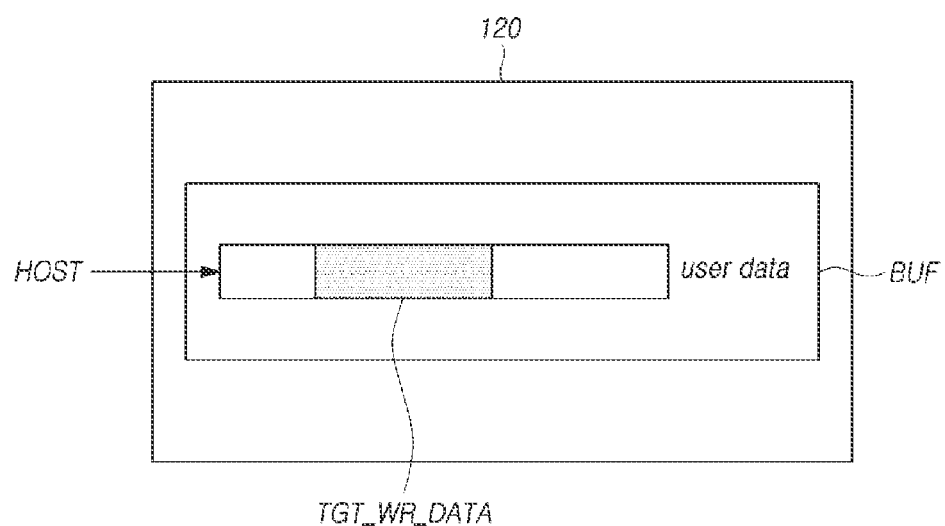
FIG. 7 is a diagram illustrating another target write data according to embodiments of the present disclosure.

FIG. 7 is a diagram illustrating another target write data according to embodiments of the present disclosure.

Referring to FIG. 7, the target write data TGT_WR_DATA may be at least a part of user data received from the host HOST.

To write user data to the memory system 100, the host HOST may transmit the user data and command to request to write the user data to the memory controller 120 in the memory system 100.

The memory controller 120 may write the user data received from the host HOST to the memory device 110 after storing the user data in a buffer BUF temporarily. For example, the buffer BUF may be a memory area in the working memory 125 described in FIG. 1

In this case, instead of immediately writing the user data received from the host to the memory device 110, the memory controller 120 may temporarily store the user data received from the host HOST to the buffer BUF until a specific condition is satisfied.

Since it is impossible to determine the target write data TGT_WR_DATA to be written to the memory device 110 while the memory controller 120 stores the user data received from the host HOST in the buffer BUF temporarily. The memory controller 120 may determine the target write data TGT_WR_DATA when the specific condition is satisfied.

For example, the memory controller 120 may determine the target write data TGT_WR_DATA when the size of user data stored in the buffer BUF temporarily is greater than or equal to a reference size. At this time, the reference size may be a unit size in which data can be written to the super memory block SBLK at a time and the size of the target write data TGT_WR_DATA may be the reference size.

For another example, the memory controller 120 may determine the target write data TGT_WR_DATA according to a command received from the host HOST, even though the size of user data temporarily stored in the buffer BUF is less than the set reference size. Hereinafter, this will be described with reference to FIG. 8.

Figure 8:
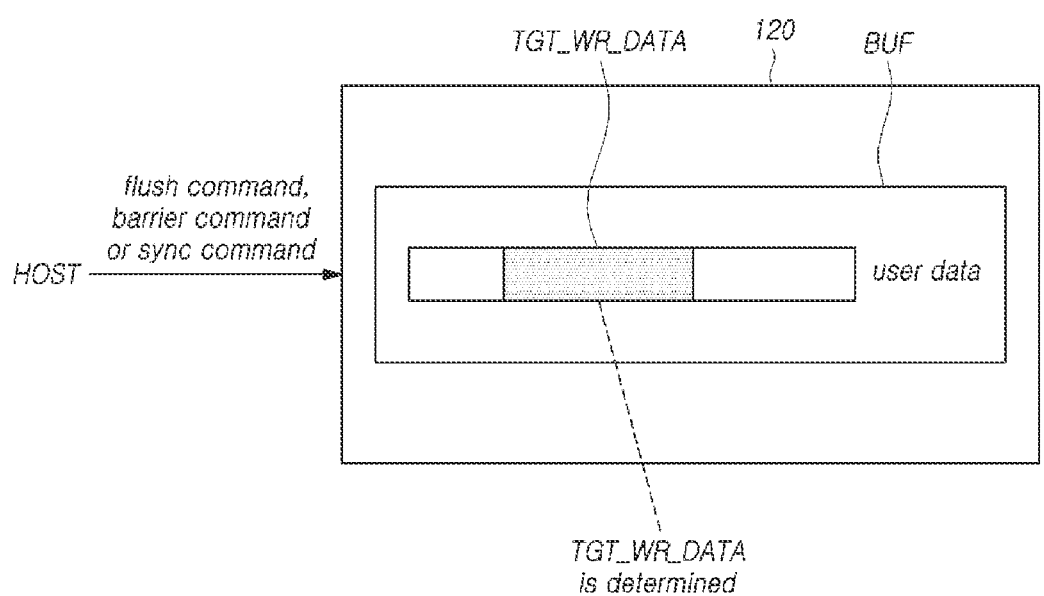
FIG. 8 is a diagram illustrating an operation in which the memory system determines the target write data in FIG. 7 according to embodiments of the present disclosure.

FIG. 8 is a diagram lustrating an operation in which the memory system determines the target write data in FIG. 7 according to embodiments of the present disclosure.

Referring to FIG. 8, the memory controller 120 of the memory system 100 may determine the target write data TGT_WR_DATA from the user data received from the host, when receiving a flush command, barrier command, or synchronization command from the host.

A flush command is a command indicating the memory system 100 to write the data requested to be written to the memory device 110 forcibly, before the host HOST transmits the flush command to the memory system 100, wherein the data is not written to the memory device 110 yet and is temporarily stored in the buffer BUF of the memory controller 120.

A barrier command is a command indicating a write order between 1) the data requested to be written before the host HOST transmits the barrier command to the memory system 100 and 2) the data requested to be written after the host HOST transmits the barrier command to the memory system 100. In this case, the data requested to be written before the host HOST transmits the barrier command to the memory system 100 should be written to the memory device 110 before the data requested to be written after the host HOST transmits the barrier command to the memory system 100.

A synchronization command is a command indicating the memory system 100 to synchronize 1) the data requested by the host HOST and 2) the data written to the memory device 110.

When the memory controller 120 receives the flush command, the barrier command or the synchronization command, the memory controller 120 may write the user data which is temporarily stored in the buffer BUF to the memory device 110 immediately without waiting for additional user data from the host HOST. Accordingly, the memory controller 120 may determine the target write data TGT_WR_DATA to be written to the memory device 110.

In the above, a specific method for the memory controller 120 to determine the target write data TGT_WR_DATA has been described.

Hereinafter, a detailed method for the memory controller 120 to determine the super memory block SBLK to write the target write data TGT_WR_DATA will be described.

Figure 9:
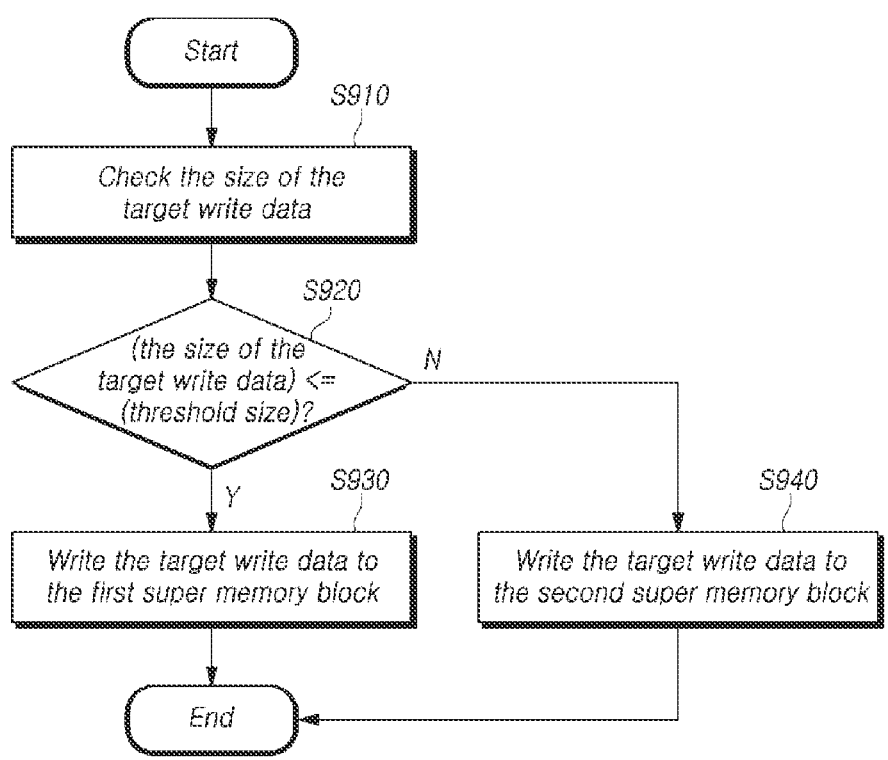
FIG. 9 is a flowchart illustrating an operation in which the memory system determines a super memory block to which the target write data is written according to embodiments of the present disclosure.

FIG. 9 is a flowchart illustrating an operation in which the memory system determines a super memory block to which the target write data is written according to embodiments of the present disclosure.

Referring to FIG. 9, the memory controller 120 of the memory system 110 may check the size of the target write data TGT_WR_DATA to be written to the memory device 110 (S910).

The memory controller 120 may determine whether the size of the target write data TGT_WR_DATA is less than or equal to a set threshold size (S920).

When the size of the target write data TGT_WR_DATA is less than or equal to the set threshold size (S920-Y), the memory controller 120 may write the target write data TGT_WR_DATA to the first super memory block SBLK_1 described in FIG. 5 (S930).

On the other hand, when the size of the target write data TGT_WR_DATA is greater than the set threshold size (S920-N), the memory controller 120 may write the target write data TGT_WR_DATA to the second super memory block SBLK_2 described in FIG. 5 (S940).

That is, the memory controller 120 may determine the super memory block to which the target write data TGT_WR_DATA is to be written based on the set threshold size. Accordingly, the set threshold size may affect the determination of the super memory block to which the target write data TGT_WR_DATA is to be written.

Figure 10:
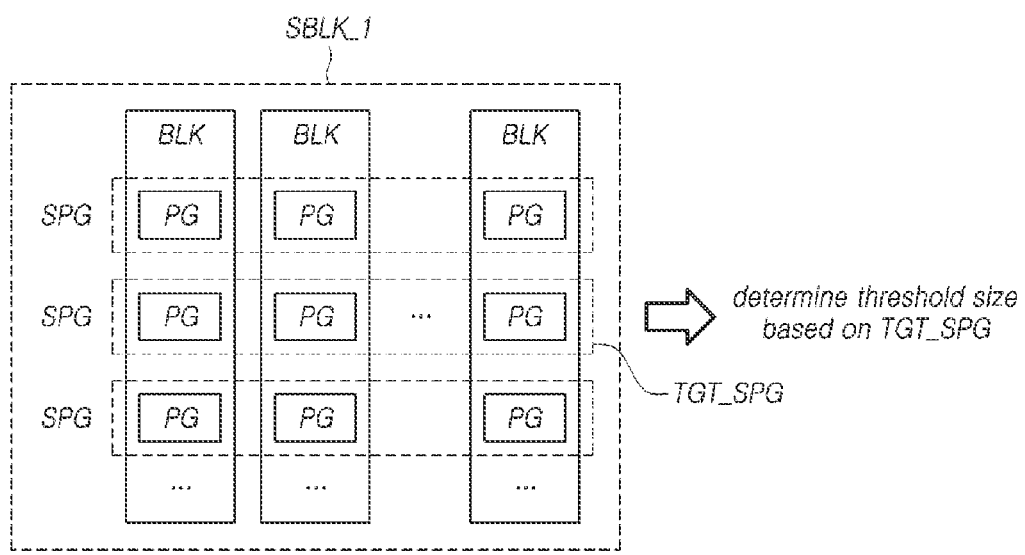
FIG. 10 is a diagram illustrating an operation in which the memory system determines a threshold size disclosed in FIG. 9 according to embodiments of the present disclosure.

FIG. 10 is a diagram illustrating an operation in which the memory system determines the threshold size disclosed in FIG. 9 according to embodiments of the present disclosure.

Referring to FIG. 10, the memory controller 120 of the memory system 100 may determine the threshold size based on a target super page TGT_SPG. The target super page TGT_SPG is a page into which data is to be written within the first super memory block SBLK_1 and the target super page is one of a plurality of super pages SPG each including two or more pages in the first super memory block SBLK_1.

In an embodiment of the present disclosure, a super memory block SBLK may include a plurality of super pages SPG. A super page SPG may include two or more pages in the super memory block SBLK and the size of the super page may be the unit size in which data is written to the super memory block SBLK. Also, the first super memory block SBLK_1 may include a plurality of super pages SPG.

Each of the plurality of super pages SPG included in the first super memory block SBLK_1 may include two or more pages PG included in the first super memory block SBLK_1. While writing data to the first super memory block SBLK_1, the memory controller 120 may control the memory device 110 to write data in units of super pages SPG.

In this case, each of the pages PG included in one super page SPG may be, for example, a page included in different memory blocks BLK respectively. The index of the word line corresponding to each of the pages PG included in a super page SPG may be the same. Or, the index of the word line corresponding to each of the pages PG included in a super page SPG may be different based on start position of the super page.

Among the plurality of super pages SPG included in the first super memory block SBLK_1, some are super pages to which valid or invalid data is already written and the rest are super pages in an erase state, to which new data is enabled to be written.

Among the plurality of super pages SPG included in the first super memory block SBLK_1, the memory controller 120 may determine a target super page TGT_SPG, which is a super page SPG to which data is to be written next, from among the remaining super pages SPG except for the super page to which data has already been written.

The memory controller 120 may determine the threshold size as the maximum value available to store data within the target super page TGT_SPG of the first super memory block SBLK_1. If the size of the target write data TGT_WR_DATA is greater than the threshold size of the target super page TGT_SPG within the first super memory block SBLK_1, the memory controller 120 may write the target write data TGT_WR_DATA to the second super memory block SBLK_2 because the target write data TGT_WR_DATA cannot be written to the target super page TGT_SPG of the first super memory block SBLK_1.

On the other hand, if the size of the target write data TGT_WR_DATA is less than or equal to the threshold size of the target super page TGT_SPG within the first super memory block SBLK_1, the memory controller 120 may write the target write data TGT_WR_DATA to the first super memory block SBLK_1 because the target write data TGT_WR_DATA can be written to the target super page TGT_SPG within the first super memory block SBLK_1. In this case, the threshold size of the target super page TGT_SPG may be maximum value of the data size that can be written to the target super page TGT_SPG.

Figure 11:
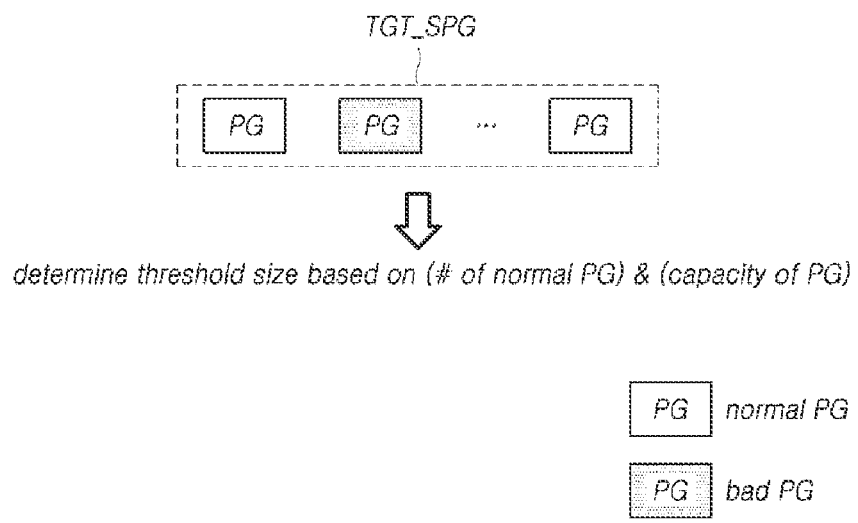
FIG. 11 is a diagram illustrating an operation in which the memory system determines the threshold size based on target super page disclose in FIG. 10 according to embodiments of the present disclosure.

FIG. 11 is a diagram illustrating an operation in which the memory system determines the threshold size based on target super page disclose in FIG. 10 according to embodiments of the present disclosure.

Referring to FIG. 11, the memory controller 120 of the memory system 100 may determine the threshold size based on the number of normal pages PG and a storage capacity of each of the normal pages PG. The normal pages are pages other than a bad page corresponding to the bad word line within the target super page TGT_SPG.

When a page corresponding to a bad word line exists in the target super page TGT_SPG, data is not written to the page corresponding to the bad word line. This is because a fail may occur while writing data to the page corresponding to the bad word line. The memory controller 120 may check whether a page in the target super page TGT_SPG is a page corresponding to a bad word line or not, and may skip writing data to the page if the page corresponds to a bad word line.

So, the memory controller 120 may determine, as the threshold size, the maximum value of the storage capacity of the normal pages other than the bad page corresponding to the bad word line within the target super page TGT_SPG.

As an example, the target super page TGT_SPG includes 4 pages PG and the storage capacity of each page PG is 4 KB.

For example, if 2 pages PG among pages included in the target super page TGT_SPG are bad pages corresponding to bad word lines, the threshold size of the target super page TGT_SPG is determined as 8 KB, which is a value obtained by multiplying the number of remaining pages of the target super page TGT_SPG excluding the page corresponding to the bad word line 2=4−2 by the storage capacity of each page (PG) 4 KB.

For another example, if 1 pages PG among pages included in the target super page TGT_SPG is a bad page corresponding to a bad word line, the threshold size of the target super page TGT_SPG is determined as 12 KB, which is a value obtained by multiplying the number of remaining pages of the target super page TGT_SPG excluding the page corresponding to the bad word line 3=4−1 by the storage capacity of each page (PG) 4 KB.

Figure 12:
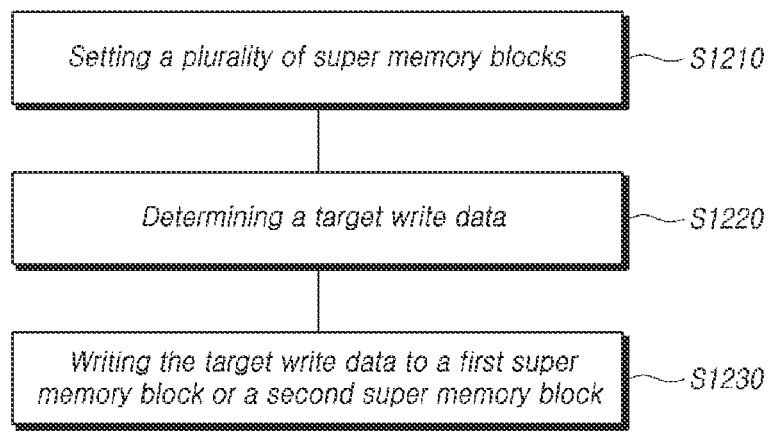
FIG. 12 is a flowchart illustrating a method for operating the memory system according to an embodiment of the present disclosure.

FIG. 12 is a flowchart illustrating a method for operating the memory system according to an embodiment of the present disclosure.

Referring to FIG. 12, a method for operating the memory system 100 may include setting a plurality of super memory blocks SBLK each including one or more of the plurality of memory blocks BLK included in the memory device 110 (S1210).

In addition, a method for operating the memory system 100 may include determining a target write data TGT_WR_DATA which is to be written to one of the plurality of super memory blocks SBLK (S1220).

In this case, the target write data TGT_WR_DATA may be meta-data. For example, the target write data TGT_WR_DATA may be map data which includes mapping information between a logical address and a physical address.

For another example, the target write data TGT_WR_DATA may be at least a part of user data received from a host, wherein the host requests the memory system 100 to write the user data. The memory system 100 may determine the target write data TGT_WR_DATA when receiving a flush command, barrier command or synchronization command from the host HOST.

In addition, a method for operating the memory system 100 may include writing the determined target write data TGT_WR_DATA to a first super memory block SBLK_1 which includes at least one bad word line or a second super memory block SBLK_2 which includes no bad word line (S1230).

The memory system 100 may write the target write data to the first super memory block when the size of the target write data is less than or equal to a set threshold size. And the memory system 100 may write the target data to the second super memory block when the size of the target write data is greater than the set threshold size.

In this case, the memory system 100 may set the threshold size based on a target super page TGT_SPG, into which the target data is written within the first super memory block SBLK_1. The target super page TGT_SPG may include two or more pages in the first super memory block SBLK_1.

The threshold size may be set based on the number of normal pages and a storage capacity of each of the normal pages, wherein the normal pages are pages other than a bad page corresponding to a bad word line within the target super page TGT_SPG.

Figure 13:
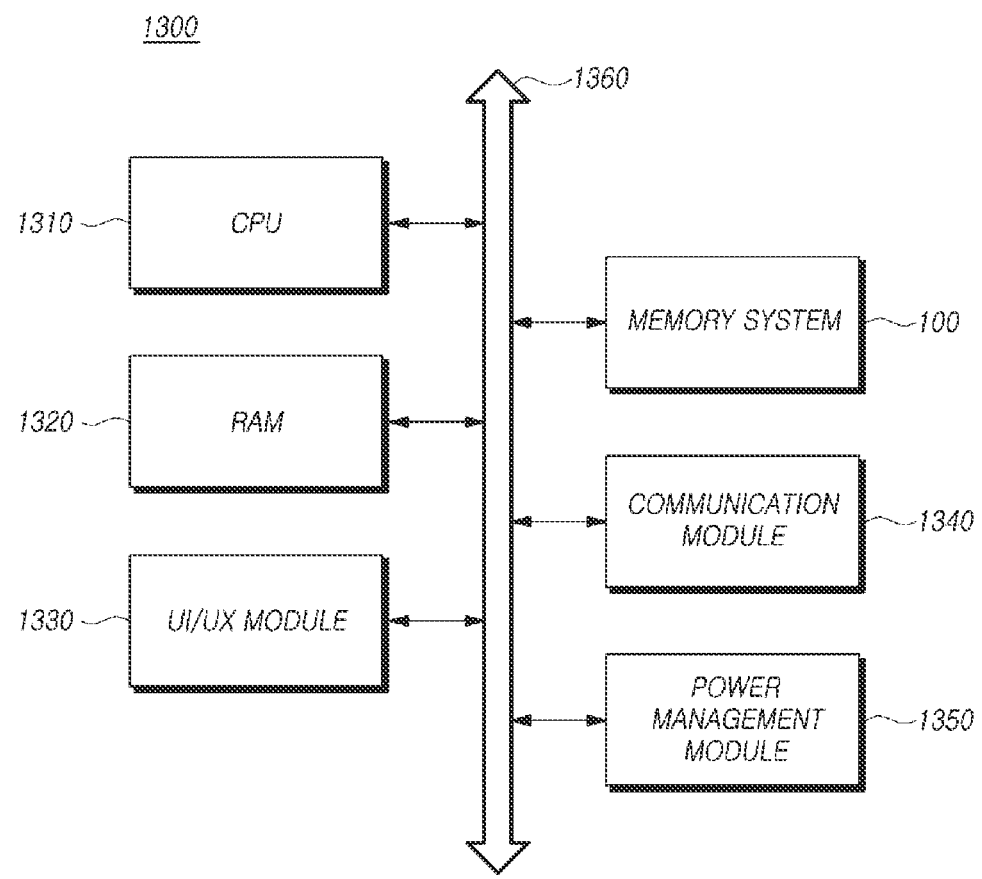
FIG. 13 is a diagram illustrating the configuration of a computing system based on some embodiments of the disclosed technology.

FIG. 13 is a diagram illustrating the configuration of a computing system 1300 based on an embodiment of the disclosed technology.

Referring to FIG. 13, the computing system 1300 based on an embodiment of the disclosed technology may include: a memory system 100 electrically connected to a system bus 1360; a CPU 1310 configured to control the overall operation of the computing system 1300; a RAM 1320 configured to store data and information related to operations of the computing system 1300; a user interface/user experience (UI/UX) module 1330 configured to provide the user with a user environment; a communication module 1340 configured to communicate with an external device as a wired and/or wireless type; and a power management module 1350 configured to manage power used by the computing system 1300.

The computing system 1300 may be a personal computer (PC) or may include a mobile terminal such as a smartphone, a tablet or various electronic devices.

The computing system 1300 may further include a battery for supplying an operating voltage, and may further include an application chipset, a graphic-related module, a camera image processor, and a DRAM. Other elements would be apparent to a person skilled in the art.

The memory system 100 may Include not only a device configured to store data in a magnetic disk such as a hard disk drive (HDD), but also a device configured to store data in a nonvolatile memory such as a solid state drive (SSD), a universal flash storage device, or an embedded MMC (eMMC) device. The non-volatile memory may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. In addition, the memory system 100 may be implemented as storage devices of various types and mounted inside various electronic devices.

Based on embodiments of the disclosed technology described above, the operation delay time of the memory system may be advantageously reduced or minimized. In addition, based on an embodiment of the disclosed technology, an overhead occurring in the process of calling a specific function may be advantageously reduced or minimized. Although various embodiments of the disclosed technology have been described with particular specifics and varying details for illustrative purposes, those skilled in the art will appreciate that various modifications, additions and substitutions may be made based on what is disclosed or illustrated in the present disclosure without departing from the spirit and scope of the invention as defined in the following claims. Furthermore, the embodiments may be combined to form additional embodiments.

What is claimed is:

1. A memory system comprising:
   a memory device including a plurality of memory blocks; and
   a memory controller for communicating with the memory device and controlling the memory device,
   wherein the memory controller is configured to:
   determine a target write data which is to be written to one of a plurality of super memory blocks, wherein each super memory block includes one or more of the plurality of memory blocks, and
   write the target write data, based on a size of the target write data, to a first super memory block which includes at least one bad word line or a second super memory block which includes no bad word line, and
   wherein the memory controller writes the target write data to the first super memory block when the size of the target write data is less than or equal to a set threshold size and writes the target data to the second super memory block when the size of the target write data is greater than the set threshold size.

2. The memory system of claim 1, wherein the target write data is meta-data.

3. The memory system of claim 2, wherein the target write data is map data which includes mapping information between a logical address and a physical address.

4. The memory system of claim 1, wherein the target write data is at least a part of user data received from a host, wherein the host requests the memory system to write the user data.

5. The memory system of claim 4, wherein the memory controller determines the target write data within the user data received from the host when receiving a flush command, barrier command or synchronization command from the host.

6. The memory system of claim 1, wherein the memory controller is further configured to set the threshold size based on a target super page, into which the target write data is to be written within the first super memory block, the target super page including two or more pages.

7. The memory system of claim 6, wherein the memory controller sets the threshold size based on a number of normal pages and a storage capacity of each of the normal pages, wherein the normal pages are pages other than a page corresponding to the bad word line within the target super page.

8. A method for operating a memory system including a memory device having a plurality of memory blocks, the method comprising:
   setting a plurality of super memory blocks each including one or more of the plurality of memory blocks;
   determining a target write data which is to be written to one of the plurality of super memory blocks; and
   writing the target write data, based on a size of the target write data, to a first super memory block which includes at least one bad word line or a second super memory block which includes no bad word line,
   wherein the target write data is written to the first super memory block when the size of the target write data is less than or equal to a set threshold size and written to the second super memory block when the size of the target write data is greater than the set threshold size.

9. The method of claim 8, wherein the target write data is meta-data.

10. The method of claim 9, wherein the target write data is map data which includes mapping information between a logical address and a physical address.

11. The method of claim 8, wherein the target write data is at least a part of user data received from a host, wherein the host requests the memory system to write the user data.

12. The method of claim 11, wherein the target write data is determined within the user data received from the host when receiving a flush command, barrier command or synchronization command from the host.

13. The method of claim 8, further comprising setting the threshold size based on a target super page, into which the target write data is to be written within the first super memory block, the target super page including two or more pages.

14. The method of claim 13, wherein the threshold size is set based on a number of normal pages and a storage capacity of each of the normal pages, wherein the normal pages are pages other than a page corresponding to the bad word line within the target super page.

* * * * *